United States Patent Office 3,684,569
Patented Aug. 15, 1972

3,684,569

PROCESS OF PRODUCING CONDUCTIVE GOLD PATTERNS

Alvin A. Milgram, Wilmington, Del., assignor to E. I. du Pont de Nemours and Company, Wilmington, Del.

No Drawing. Continuation-in-part of application Ser. No. 725,493, Apr. 30, 1968. This application Oct. 6, 1970, Ser. No. 78,620
Int. Cl. H05k *1/00*
U.S. Cl. 117—212 5 Claims

ABSTRACT OF THE DISCLOSURE

Gold patterns are produced by a process which utilizes a combination of steps involving heat and ultraviolet light treatments. The conductive gold patterns can be applied on various insulating substrates, such as glass and various ceramic materials.

CROSS-REFERENCE TO RELATED APPLICATION

This application is a continuation-in-part of copending application S.N. 725,493, filed Apr. 30, 1968, now abandoned.

BACKGROUND OF THE INVENTION

It is known to apply metal patterns to a support by first coating the surface of the support with a uniform layer of the revelant metal, whereupon a resist is photographically applied, the excess metal then being etched away. The application of such resist is effected by means of a soluble composition consisting of macromolecular substance which becomes insoluble by exposure. The nonexposed parts of the metal layer on a support coated with this composition are treated with a solvent, as a result of which these parts become accessible to an etching agent, while the metal pattern to be produced is screened from attack by the then insoluble composition present thereon. It is also known to harden the insoluble composition completely by heating as a result of which the resistance to etching agents is further increased.

The methods in which use is made of etching leave much to be desired. It is comparatively difficult to remove the resist after the metal has been etched away; as a rule, solvents for this purpose do not exist but for certain cases there are liquids which give rise to swelling of the hardened resist, as a result of which the adherence is reduced and the layer can be scratched away. When use is made of ceramic supports, which are always slightly porous and readily hold adsorbed residual etching agents, the risk of corrosion is not great.

Thus, there is a need in this art to provide a better process for applying and producing gold patterns. In particular, there is a need for a simpler process without the problems involved in the use of photoresist procedures in the manufacture of conductive gold patterns.

SUMMARY OF THE INVENTION

This invention relates to a process of producing a conductive gold pattern on an insulating substrate comprising the following sequential steps: (a) uniformly coating the substrate with a liquid gold resinate composition to produce a film thereon; (b) presensitizing the film by heating to a temperature within the range of about 200–300° C. to remove at least part of the volatilizable components of the gold resinate film and at the same time foster growth of fine colloidal particles of gold; (c) exposing a desired pattern on the presensitized film to ultraviolet light, thereby producing exposed and unexposed portions of the film; (d) heating the coated substrate to a temperature within the range of about 350–425° C. to form a hardened gold film from the unexposed portion of the gold film, the hardened film including larger colloidal particles of gold; (e) washing away the exposed portion of the film with a suitable solvent; and (f) then firing the substrate and remaining film (the coated substrate) to a temperature in the range of about 600–800° C. to form a firmly adherent, continuous gold film on the substrate corresponding to the portion of the film unexposed in step (c).

This process provides a convenient means of producing conductive gold patterns for electronic circuits. More particularly, patterns with well defined edges can be readily provided in accordance with this process.

DESCRIPTION OF THE PREFERRED EMBODIMENTS

The preferred utility for the processes of this invention is directed to producing conductive gold patterns for electronic circuits. It is well known that conductive patterns may be produced by screen printing conductive metallizing compositions onto various substrates. In contrast, this process is directed to the use of masks or screens to expose various portions of a gold film to provide fine line conductive patterns. The gold patterns may be applied to any substrates, but in particular are particularly applicable to insulating substrates. Any of the conventional insulating substrates may be used. These include glass, alumina, magnesium oxide, mica, quartz and various other ceramic and crystalline substrates.

Step (a) of the process involves uniformly coating the insulating substrate with a liquid bright gold resinate composition to produce a gold resinate film thereon. This can be accomplished by any of the common coating procedures, such as by spraying, brushing, dipping, painting, etc.

The liquid bright gold resinate composition can be any of the conventional gold resinate compositions which are well known in the art; for example, see U.S. Pats. 2,490,399; 2,994,614 and 3,268,568. Such liquid gold resinate compositions may be prepared by any of the well known techniques. For example, (1) an organic gold resinate compound and a gold flux, with or without a liquid vehicle, may be simply admixed; or (2) the same components and optional additives may be dissolved to form a solution which is then heated to 120–130° C. until a gel forms; or (3) the liquid gold resinate compositions may be rolled in a mill to produced a smooth paste for application directly to a substrate.

The organic gold resinate compound in the liquid bright gold resinate composition may be any of the conventional gold compounds used heretofore. These include gold resinates such as sulfurized gold terpene resinates (including the gold aryl mercaptides described in U.S. Pat. 2,490,399) and any gold mercaptides.

The particular solvent or mixture of solvents used for liquid gold resinate compositions is a matter of choice depending upon the method of application used, for example, whether the gold resinate composition is to be applied by a stamping operation, by a painting operation, or by means of a squeegee through a screen. The different solvents used will impart to the composition differences in interfacial tension, surface tension, evaporation rate, viscosity, etc. As a consequence, different solvents and mixture of solvents which impart specific application characteristics to the gold decorating compositions may be used for any particular purpose. Furthermore, different solvents and mixtures of solvents are recommended for different methods of application. Typical solvents usable in this invention, alone or as mixtures, include: methyl ethyl ketone, cyclohexanone, ethyl acetate, amyl acetate, Cellosolve, butanol.

nitrobenzene, toluene, xylene, petroleum ether, chloroform, carbon tetrachloride, various terpenes, such as pinene, dipentene, dipentene oxide, and the like, essential oils, such as oils of lavender, rosemary, aniseed, sassafras, wintergreen, fennel and turpentine, various rosins and balsams, and synthetic resins.

An example of a very suitable solvent (all of the components of which volatilize below about 260° C.) is set forth below:

SOLVENT A

| Component: | Parts by weight |
|---|---|
| Ortho nitrotoluene | 30 |
| Cineol | 25 |
| Monochlorobenzene | 20 |
| Synthetic camphor | 15 |
| Spike lavender oil | 10 |

The particular gold flux used in any given gold decorating composition is also largely a matter of choice and depends somewhat upon the type of ceramic material to be decorated therewith. A gold flux is used for the purpose of promoting firm adherence of the fired gold film to the substrate, and also to promote brilliance of the gold film. A number of fluxing materials which will enhance adherence and brilliance of gold films are known in the art. For example, salts and resinates of bismuth, cadmium, lead, copper, cobalt, antimony, uranium, iridium, rhodium, vanadium, chromium, and tin may be used for this purpose. Any of the fluxes heretofore used in the art to promote proper appearance and adherence, many of which are commercially available, may be used to likewise promote appearance and adherence. Generally, it is most desirable that the gold flux be soluble in the solvent system, where employed. A number of gold fluxes are usually needed in combination with each other to produce most satisfactory results in the ultimate fired gold films.

It is sometimes desirable to add viscosifying agents such as pine rosin or a reaction product of pine rosin and sulfur to the liquid gold resinate composition. Particularly gratifying results have been obtained by the use of a viscosifying agent which is obtained by heating the following components to 160–170° C. to form a reaction product:

VISCOSIFYING AGENT A

| Component | Parts by weight |
|---|---|
| Pine rosin | 90 |
| Flowers of sulfur | 10 |

Step (b) in the process of the present invention is a presensitizing procedure which involves slowly heating the coated substrate to a temperature in the range of about 200–300° C. Normally, this procedure entails slowly heating the coated substrate in air whereby some of the volatile material from the liquid gold resinate composition is removed. This presensitizing step also prepares the gold film for the later treatment with ultraviolet light. It is theorized that step (b) fosters formation of small colloidal particles of gold. After the coated substrate is slowly heated to a temperature in the above range, the coated substrate may be held at the peak temperature for a short time, e.g., up to 10 minutes. The time and temperature selected for step (b) must be such that (1) at least partial removal of volatiles (decomposed organics in the resinate and optional solvent) occurs and (2) fine gold colloidal particles (e.g., 20 angstrom particles) are formed.

In step (c) a pattern is exposed to ultraviolet light behind a negative mask, thereby producing exposed and unexposed portions of the gold film. By using a negative mask, the conductor pattern lines are not exposed to the ultraviolet light while the undesired portion of the gold film is exposed to ultraviolet light. It is theorized that the ultimate effect of the ultraviolet light is to retard the growth during the subsequent firing operation in step (d) of the fine colloidal gold particles which were formed in step (b). The strength of the ultraviolet light and the time of exposure can be adjusted to optimize conditions. The greater the strength of the U.V. light, the less time required to effect the change in the relative rates of the colloidal particles size growth of the gold film in the exposed and unexposed portions of the film. In the example below, with a weak source of U.V. light, the exposure time was 16 hours. With the same U.V. source exposure times of 3–67 hours were found useful in this invention. The greater the energy of the U.V. source, the less will be the requisite exposure time to produce a differential in the hardening rate (formation of larger gold colloids) between the exposed and unexposed portions of the film when heated in step (d).

Step (d) is a very critical step in this process. It involves heating the substrate (and the gold film thereon) to a temperature higher than that of step (b), and usually within the range of about 350–425° C., to form a hardened gold film from the unexposed portion of the gold film. In the unexposed portion, i.e., the portion which was not exposed to ultraviolet light in step (c), the gold film will develop and harden. The portion which was exposed to the ultraviolet light does not develop and harden to form a substantial gold film in this step due to the effect of the ultraviolet light. This temperature range has been selected so that the desired conductor pattern (which is the portion unexpected to U.V. light) develops to form a hardened gold film on the substrate. If temperatures lower than about 300° C. are used, a hardened gold film does not develop on any portion of the gold film; higher temperatures tend to partially develop the exposed portions of the gold film making it indistinguishable from the unexposed portion. The unpper temperature limitation, generally not above about 425° C., is the temperature at which the exposed portion of the gold film beings to develop a hardened gold film. Therefore, it is very important to keep the temperature within this range to produce a hardened, well defined gold conductor pattern from the unexposed portion of the gold film. It is theorized that the ultraviolet treatment of the exposed portions in step (c) causes a lag in the development of larger colloids of gold during the heat treatment of step (d), as compared with the unexposed portions which develop hardened patterns more quickly in step (d). The temperature and the time of heat treatment in step (d) must be such that the time lag in film hardening in the portion exposed to U.V. light is maintained. Were high temperatures and long heating times employed in step (d), both the exposed and unexposed areas would harden in step (d) and, thus, preclude step (e) pattern formation. In the example below, the substrate was reheated to 400° C. in step (d) and held there for 5 minutes. Generally, heating at peak temperature for less than 10 minutes will be employed in step (d).

Step (e) involves washing away the exposed portion of the gold film with a suitable solvent. Depending upon the particular liquid gold composition utilized, a suitable solvent must be selected by one skilled in the art. The preferred solvent is nitric acid. The exposed portion is washed away within a few minutes.

The final step of the process, step (f), is a firing operation wherein the entire assembly (e.g., the substrate and remaining gold film) is fired at a temperature in the range of about 600–800° C. to form a firmly adherent, continuous gold film on the substrate. The purpose of this step is to firmly secure and bond the gold film to the substrate. After step (f), the coated substrate is ready for use as a conductor.

The present invention is illustrated by the following example. In the example and elsewhere in the specification, all parts, ratios and percentages of materials or components are by weight.

EXAMPLE

A liquid gold resinate composition containing resinate, solvent and viscosifying agent was prepared by mixing the following components in the following proportions.

| Component: | Parts by weight |
|---|---|
| Gold pinene mercaptide (prepared as described in Example 1 of U.S. Pat. 2,490,399) | 20.0 |
| Solvent A | 50.9 |
| Viscosifying Agent A | 23.0 |
| Vanadium resinate (6% V) | 2.5 |
| Rhodium resinate (3% Rh) | 0.6 |
| Bismuth resinate (5% Bi) | 3.0 |

A thin layer of the above-described liquid gold resinate composition was brush coated onto a glass substrate. The coated substrate was then presensitized by slowly heating to 300° C.; after 5 minutes at 300° C., the glass substrate was allowed to cool. A negative mask was placed over a portion of the coated glass substrate. Then the glass substrate having the gold film and negative mask thereon were exposed to a weak source of ultraviolet light for approximately 16 hours. The source was Sylvania fluorescent sample No. 1114–1, F18T8/HO/BL/180°; the coated substrate was placed two inches from the outer rim of the tube along the center line.

The mask was removed and the coated substrate was reheated to a temperature of approximately 400° C. and held there for 5 minutes. Particle size growth in the gold film was observed. A bright gold film formed in the region that had not been exposed to ultraviolet light. A very clear line of demarcation was observed between the exposed and unexposed portions. Then, the developed (exposed) gold portion on the glass substrate was washed away with a solution containing 1 part water to 1 part of 70% $HNO_3$, by dipping the glass substrate into the nitric acid solution. Within 60 seconds the exposed portion had been removed from the glass surface. Finally, the coated glass substrate was fired to 600–625° C. and held at peak temperature for five minutes. A firmly adherent, durable, continuous gold film having a finely divided lines of demarcation was observed on the glass substrate.

The mechanism responsible for this phenomenon is fundamentally different from processes involving photopolymer layers with liquid bright solutions. In the prior art systems, the photosensitive polymer in the system is affected by the light and the nonexposed portion is then washed out of the composite system. The phenomenon of the present invention involves a significantly different process. In the present invention, although not intended to be limiting, it is theorized that the effect of U.V. light on presensitized films is to inhibit the rate of growth during step (d) of fine colloidal particles of gold in the area exposed to U.V., as compared with the rate of growth of such particles on the unexposed areas. Once the gold film has been exposed to U.V. light and developed by heating in step (d), the undeveloped portion is removed with a suitable solvent, leaving the desired gold pattern which may be refired in step (f).

Since it is obvious that many changes and modifications can be made in the above-described details without departing from the nature and spirit of the invention, it is to be understood that the invention is not to be limited to said details except as set forth in the appended claims.

What is claimed is:

1. A process of producing a conductive gold pattern on an insulating substrate comprising the following sequential steps:
   (a) uniformly coating the substrate with a liquid gold resinate composition to produce a film thereon;
   (b) presensitizing the film by heating to a temperature within the range of about 200–300° C.;
   (c) exposing a desired pattern on the presensitized film to ultraviolet light, thereby producing exposed and unexposed portions of the film;
   (d) heating the substrate and film to a temperature within the range of about 350–425° C. to form a hardened gold film from the unexposed portion of the gold film;
   (e) washing away the exposed portion of the film with a suitable solvent; and
   (f) firing the substrate and remaining film to a temperature in the range of about 600–800° C. to form a firmly adherent, continuous gold film on the substrate.

2. A process in accordance with claim 1 wherein said liquid gold resinate composition of step (a) additionally comprises a gold flux.

3. A process in accordance with claim 2 wherein the solvent of step (e) comprises nitric acid.

4. A process in accordance with claim 2 wherein the substrate is glass.

5. A process in accordance with claim 2 wherein the substrate is alumina.

References Cited

UNITED STATES PATENTS

| | | | |
|---|---|---|---|
| 2,435,889 | 2/1948 | Kerridge | 96—38.1 |
| 1,574,357 | 2/1926 | Beebe et al. | 96—88 |
| 3,529,961 | 9/1970 | Schaefer | 96—36.2 |
| 3,451,813 | 6/1969 | Kinney et al. | 96—36.2 |
| 3,189,482 | 6/1965 | Bajars et al. | 117—212 |

OTHER REFERENCES

Hopper: "How to Apply Noble Metals to Ceramics," in Ceramic Industry, June 1963, 4 pages.

RALPH S. KENDALL, Primary Examiner

U.S. Cl. X.R.

96—36.2; 117—93.3, 227